US011133223B2

(12) United States Patent
Shih et al.

(10) Patent No.: US 11,133,223 B2
(45) Date of Patent: Sep. 28, 2021

(54) SELECTIVE EPITAXY

(71) Applicant: Taiwan Semiconductor Manufacturing Co., Ltd., Hsinchu (TW)

(72) Inventors: Ding-Kang Shih, New Taipei (TW); Cheng-Long Chen, Hsin-Chu (TW); Pang-Yen Tsai, Hsin-Chu Hsian (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 156 days.

(21) Appl. No.: 16/512,722

(22) Filed: Jul. 16, 2019

(65) Prior Publication Data

US 2021/0020522 A1  Jan. 21, 2021

(51) Int. Cl.
 *H01L 21/8238* (2006.01)
 *H01L 27/092* (2006.01)
 (Continued)

(52) U.S. Cl.
 CPC .. *H01L 21/823814* (2013.01); *H01L 21/0262* (2013.01); *H01L 21/02236* (2013.01); *H01L 21/02255* (2013.01); *H01L 21/02532* (2013.01); *H01L 21/02576* (2013.01); *H01L 21/02636* (2013.01); *H01L 21/28518* (2013.01); *H01L 21/31116* (2013.01); *H01L 21/823821* (2013.01); *H01L 27/0924* (2013.01); *H01L 29/0847* (2013.01); *H01L 29/167* (2013.01); *H01L 29/45* (2013.01); *H01L 29/66636* (2013.01)

(58) Field of Classification Search
 CPC ..... H01L 21/823814; H01L 21/823821; H01L 29/0847; H01L 29/167; H01L 29/45; H01L 29/66636; H01L 21/02236; H01L 21/02255; H01L 21/02532; H01L 21/02576; H01L 21/0262; H01L 21/02636; H01L 21/28518; H01L 21/31116; H01L 27/0924
 See application file for complete search history.

(56) References Cited

U.S. PATENT DOCUMENTS 8,836,016 B2  9/2014  Wu et al.
8,841,701 B2  9/2014  Lin et al.
(Continued)

*Primary Examiner* — Earl N Taylor
(74) *Attorney, Agent, or Firm* — Haynes and Boone, LLP

(57) ABSTRACT

A semiconductor device and a method of making the same are provided. A method according to the present disclosure includes providing a workpiece comprising a first source/drain region in a first device region and a second source/drain region in a second device region, depositing a dielectric layer over the first source/drain region and the second source drain region, forming a first via opening in the dielectric layer to expose the first source/drain region and a second via opening in the dielectric layer to expose the second source/drain region, annealing the workpiece to form a first semiconductor oxide feature over the exposed first source/drain region and a second semiconductor oxide feature over the exposed second source/drain region, removing the first semiconductor oxide feature to expose the first source/drain region in the first via opening in dielectric layer, and selectively forming a first epitaxial feature over the exposed first source/drain region.

20 Claims, 16 Drawing Sheets

(51) Int. Cl.
*H01L 29/08* (2006.01)
*H01L 29/167* (2006.01)
*H01L 29/45* (2006.01)
*H01L 29/66* (2006.01)
*H01L 21/02* (2006.01)
*H01L 21/285* (2006.01)
*H01L 21/311* (2006.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 9,972,682 B2 * | 5/2018 | Gluschenkov .... H01L 21/28518 |
| 9,978,750 B1 * | 5/2018 | Adusumilli ....... H01L 21/26506 |
| 9,991,165 B1 | 6/2018 | Huang |
| 10,141,308 B2 * | 11/2018 | Adusumilli ....... H01L 21/26506 |
| 10,164,048 B1 | 12/2018 | More et al. |
| 10,211,207 B2 * | 2/2019 | Adusumilli ..... H01L 21/823814 |
| 10,347,762 B1 * | 7/2019 | Liu .................... H01L 29/7848 |
| 10,381,442 B2 * | 8/2019 | Gluschenkov ...... H01L 29/0847 |
| 10,431,502 B1 * | 10/2019 | Lee ................. H01L 21/76895 |
| 10,510,617 B2 * | 12/2019 | Gluschenkov ......... H01L 29/517 |
| 2015/0372100 A1 * | 12/2015 | Zschatzsch ....... H01L 29/66628 257/384 |
| 2016/0260816 A1 * | 9/2016 | Kapoor ............. H01L 29/66575 |
| 2017/0213889 A1 * | 7/2017 | Gluschenkov ........ H01L 29/665 |
| 2018/0108574 A1 * | 4/2018 | Li .................. H01L 21/823821 |
| 2018/0240875 A1 * | 8/2018 | Gluschenkov ........ H01L 29/165 |
| 2018/0261597 A1 * | 9/2018 | Adusumilli ....... H01L 21/26506 |
| 2018/0261598 A1 * | 9/2018 | Adusumilli ....... H01L 21/26506 |
| 2019/0131399 A1 * | 5/2019 | Liu ..................... H01L 29/0257 |
| 2019/0279913 A1 * | 9/2019 | Gluschenkov ........ H01L 29/513 |
| 2020/0006545 A1 * | 1/2020 | Liu ...................... H01L 21/324 |
| 2021/0020522 A1 * | 1/2021 | Shih ................. H01L 29/66636 |

* cited by examiner

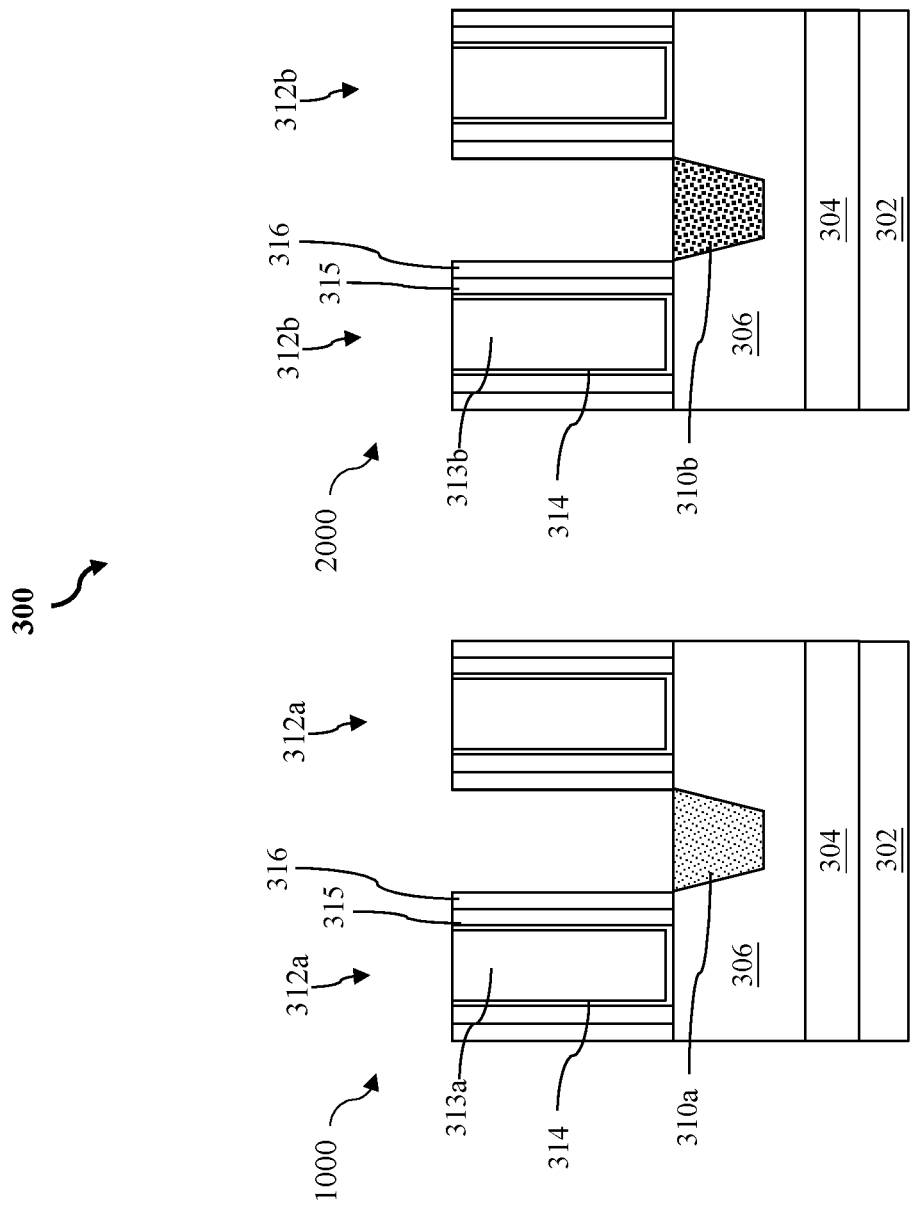

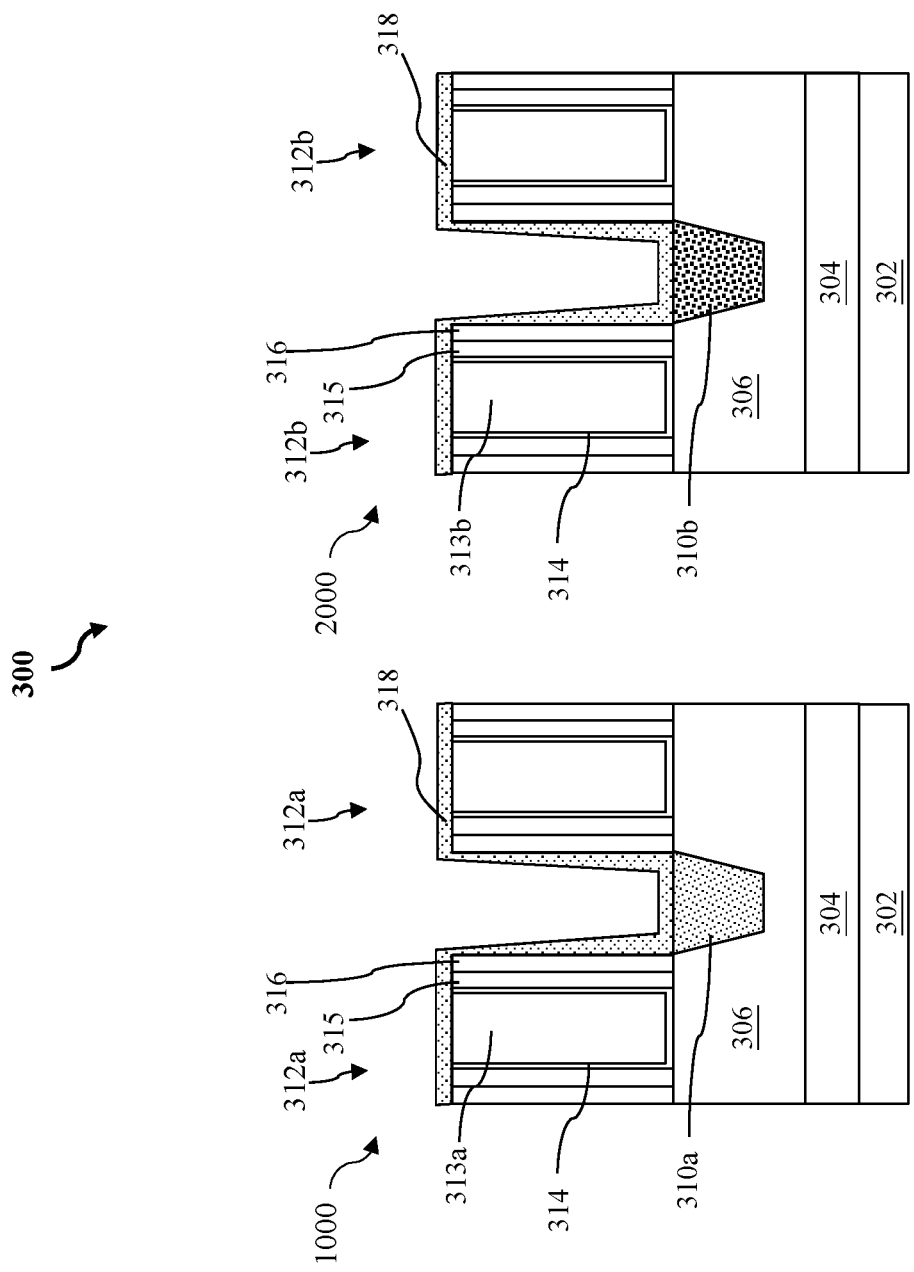

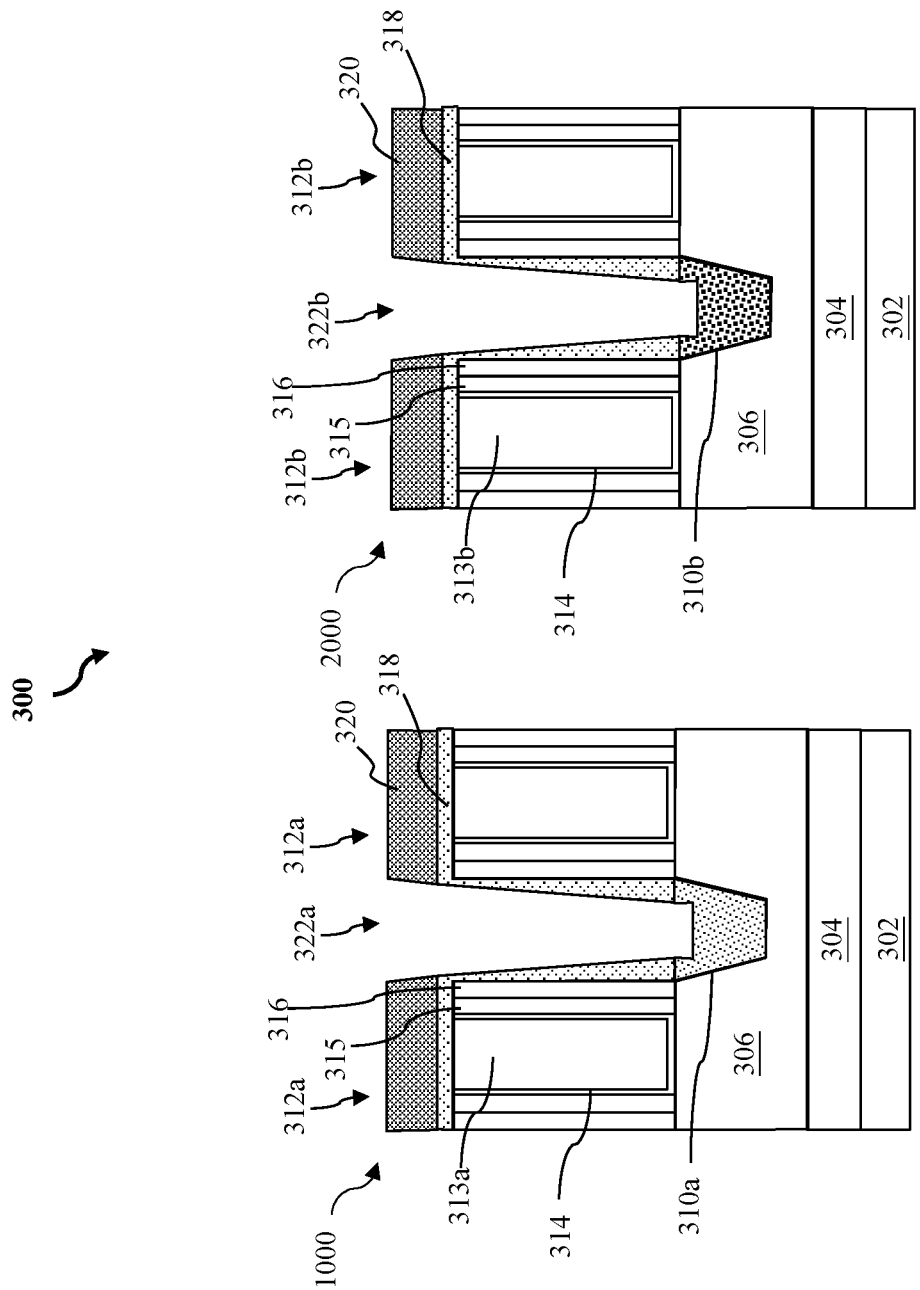

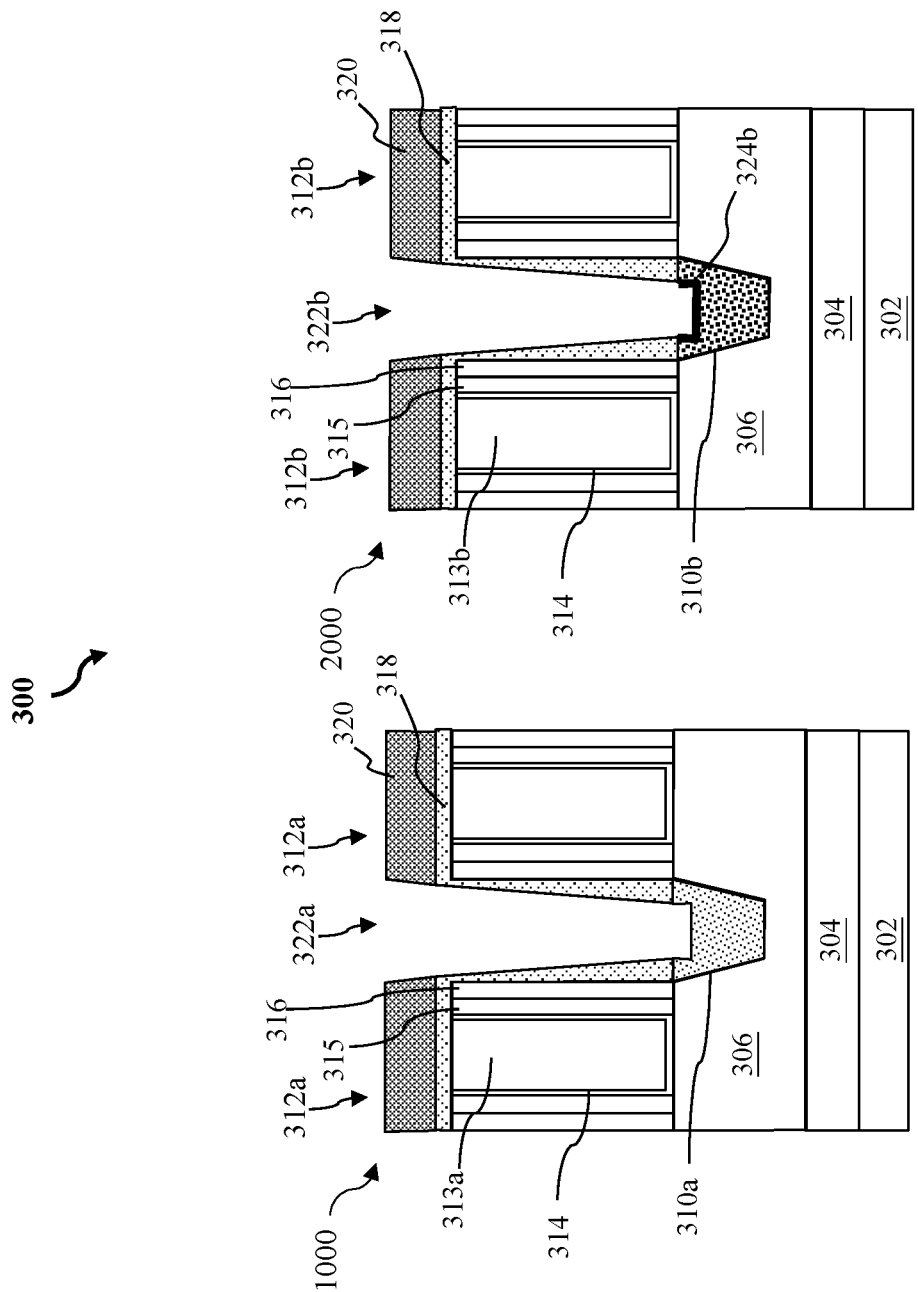

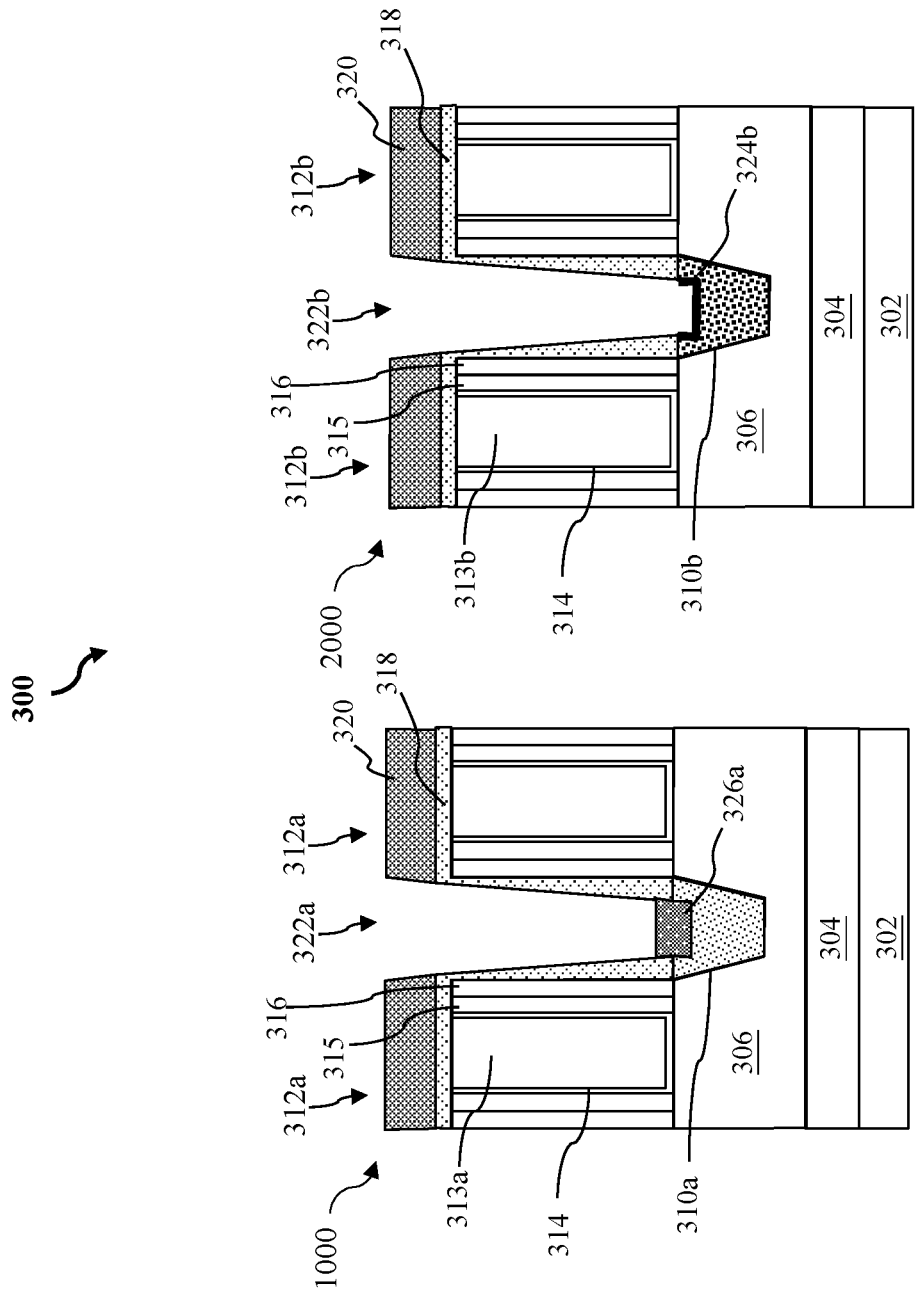

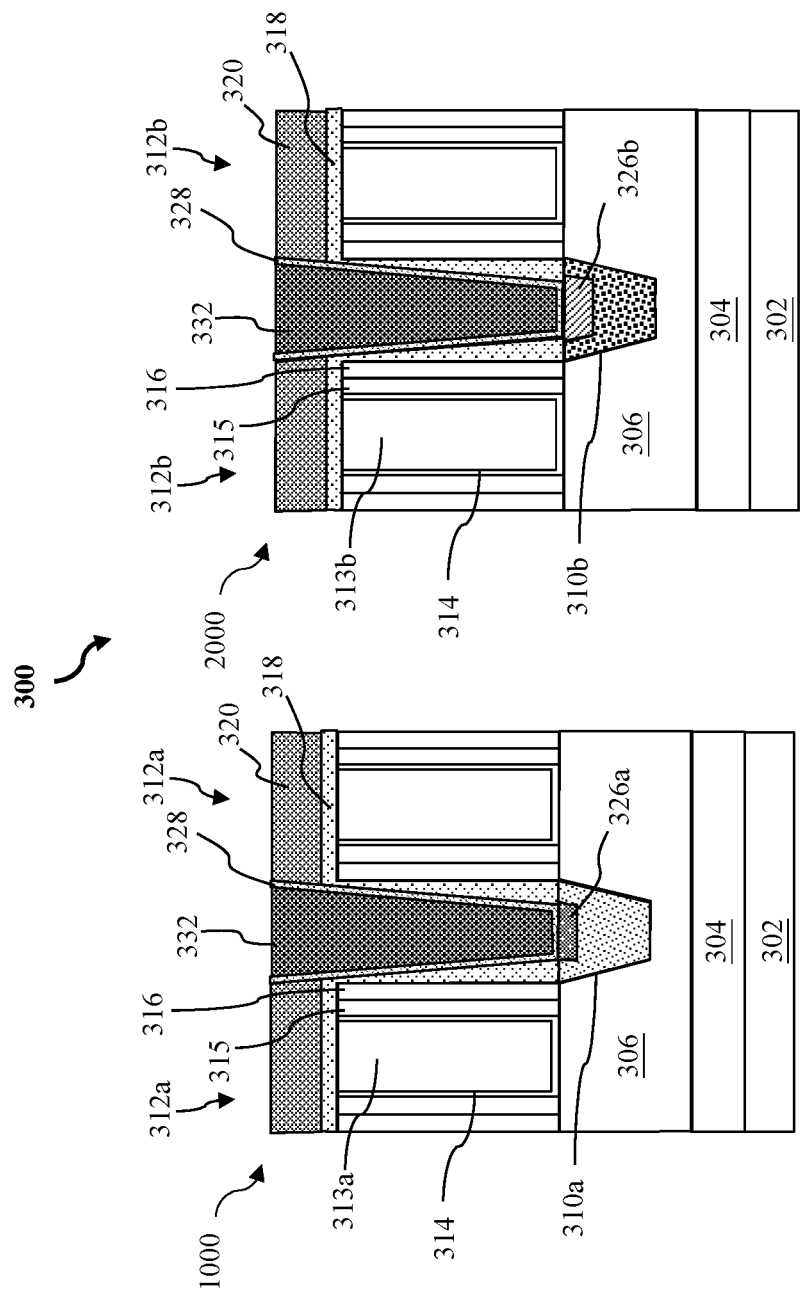

SELECTIVE EPITAXY

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) devices, gate-all-around (GAA) devices, Omega-gate ($\Omega$-gate) devices, or Pi-gate ($\Pi$-gate) devices. In these three-dimensional devices, a gate is formed over or around channel region of a body of semiconductor device. This type of gate allows greater control of the channel. Other advantages of three-dimensional devices include reduced short channel effect and higher current flow.

However, processes for forming three-dimensional devices face several challenges. For example, when forming a source/drain contact to couple to source/drain features, the source/drain features may be damaged, leading to increased contact resistance. A conventional method to remedy the damaged source/drain features is to regrow epitaxial features in different device regions. However, this conventional method requires additional lithography processes, whose costs increase as the feature size shrinks.

Therefore, although existing three-dimensional devices and processes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, and 15B illustrate fragmentary cross-sectional views of a portion of a semiconductor device on a workpiece at various stages of fabrication according to different embodiments of the present disclosure.

DETAILED DESCRIPTION

Figure 1:
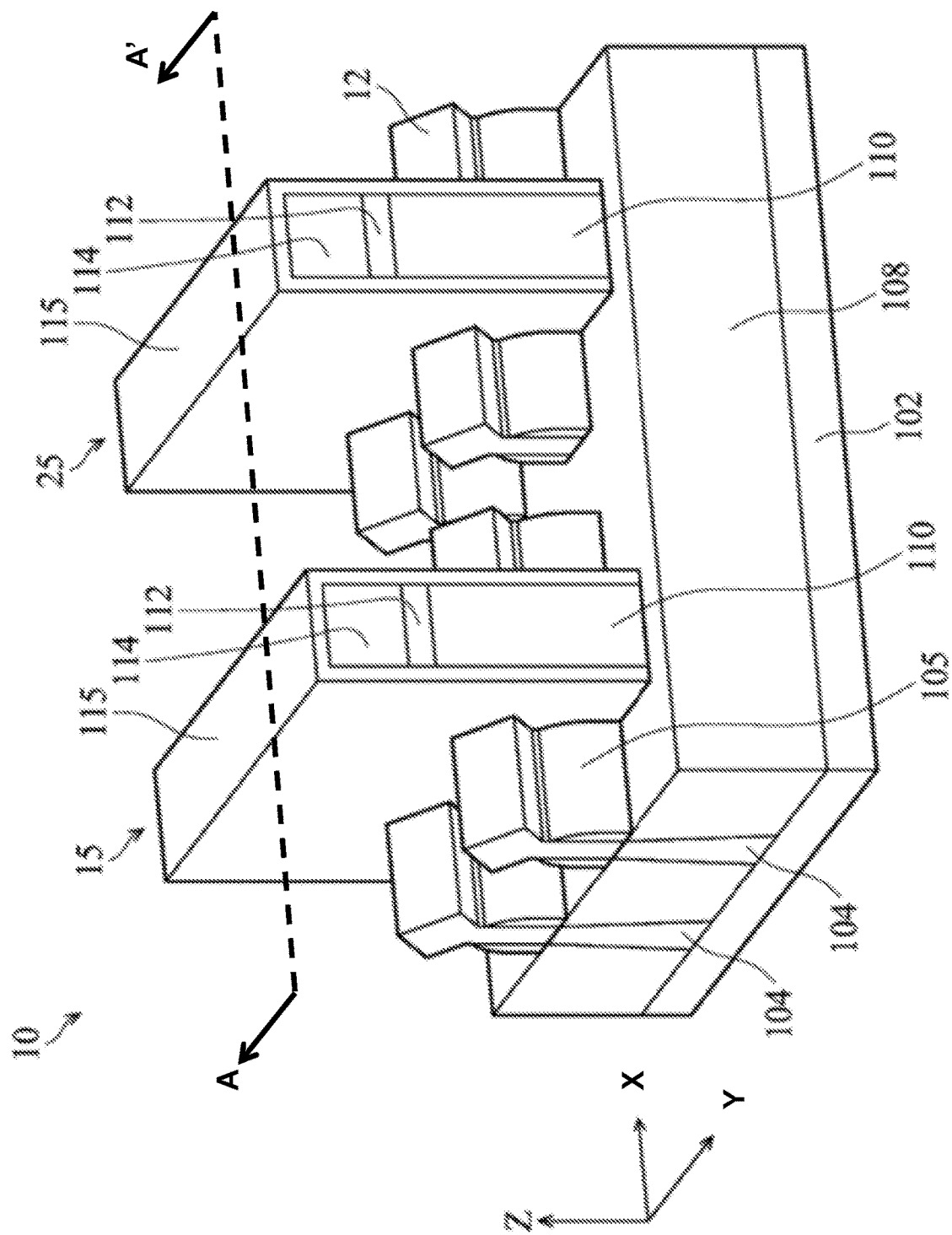
FIG. 1 is a perspective view of an example semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a process flow to regrow n-type and p-type epitaxial features separately without use of additional masks. One type of semiconductor device in which the processes of the present disclosure may be implemented may include FinFET devices. In that regard, a FinFET device is a fin-like field-effect transistor device, which has been gaining popularity in the semiconductor industry. The FinFET device may be a complementary metal-oxide-semiconductor (CMOS) device including a p-type metal-oxide-semiconductor (PMOS) FinFET device and an n-type metal-oxide-semiconductor (NMOS) FinFET device. The following disclosure may use one or more FinFET examples to illustrate various embodiments of the present disclosure, but it is understood that the application is not limited to the FinFET device, except as specifically claimed. For example, the embodiments of the present disclosure may be applicable to other three-dimensional devices, such as gate-all-around (GAA) devices, Omega-gate ($\Omega$-gate) devices, or Pi-gate ($\Pi$-gate) devices.

Referring to FIG. 1, a perspective view of an example FinFET device 10 is illustrated. The FinFET device 10 includes an n-type FinFET device structure (NMOS) 15 and a p-type FinFET device structure (PMOS) 25. The FinFET device 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device 10 also includes one or more fin structures 104 (e.g., Si fins) that extend from the substrate 102 in the Z-direction and surrounded by spacers 105 in the Y-direction. The fin structures 104 are elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a double-patterning lithography (DPL) process or a multiple-patterning lithography (MPL) process. DPL is a method of constructing a pattern on a substrate by dividing the pattern into two interleaved patterns. DPL allows enhanced feature (e.g., fin) density. The fin structure 104 also includes an epitaxial feature 12, which may (along with portions of the fin structure 104) serve as the source/drain of the FinFET device 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device 10 further includes gate structure that includes a gate electrode 110 and a gate dielectric layer (not shown) below the gate electrode 110. The gate electrode 110 may include polysilicon or metal. Gate electrode 110 may be formed in a gate first process or a gate last process (or gate replacement process). In some embodiments, the gate electrode 110 may be a functional metal gate electrode that is formed of tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. In some other embodiments, the gate electrode 110 may be a dummy gate electrode that is formed of polysilicon. In those embodiments, the gate electrode 110 may be later replaced with a functional gate electrode. Hard mask layers 112 and 114 may be used to define the gate electrode 110. A spacer 115 may also be formed on the sidewalls of the gate electrode 110 and over the hard mask layers 112 and 114. In some embodiments, the spacer 115 may include more than one spacers, which may be formed silicon nitride, silicon carbonitride, silicon oxynitride, silicon oxycarbonitride, or other suitable dielectric materials.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate structure may include additional layers, such as interfacial layers, metal capping layers, self-aligned contact (SAC) dielectric layers, diffusion layer, barrier layers, or other applicable layers. In some embodiments, the gate structure is formed over a central portion of the fin structure 104. In some other embodiments, multiple gate structures are formed over the fin structure 104.

The gate structure is formed by a deposition process, a photolithography process and an etching process. The deposition process may include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices, like other three-dimensional devices, offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip. However, processes for forming three-dimensional devices face several challenges. For example, when forming a source/drain contact to couple to source/drain features, a via opening is formed through a dielectric layer, such as an interlayer dielectric (ILD) layer, to expose the source/drain features. The via opening formation may be performed using reactive ion etch (RIE) process and inevitably results in damage or volume loss of the source/drain feature in the source/drain region. Volume loss or damages of the source/drain feature may lead to poor contact landing and increased contact resistance. Some conventional methods to remedy the damaged source/drain features include separately regrowing n-type and p-type epitaxial features in the respective device region. However, this conventional method requires additional lithography processes, which involves ever increasing cost as the feature size shrinks.

To overcome the problems discussed above, the present disclosure utilizes a novel fabrication process flow to separately regrow source/drain epitaxial features in different device regions without additional lithography processes. Advantageously, the fabrication processes of the present disclosure utilizes different oxidization rates of different semiconductor materials and characteristics of the epitaxy processes to regrow n-type epitaxial source/drain feature while the p-type source/drain region is protected by a semiconductor oxide and to regrow p-type epitaxial source/drain feature while the n-type source/drain region is protected by heavily doped n-type source/drain features. The separate regrowth of epitaxial features remedies volume loss of epitaxial feature during via opening formation and does not require additional lithography processes.

Figure 2:
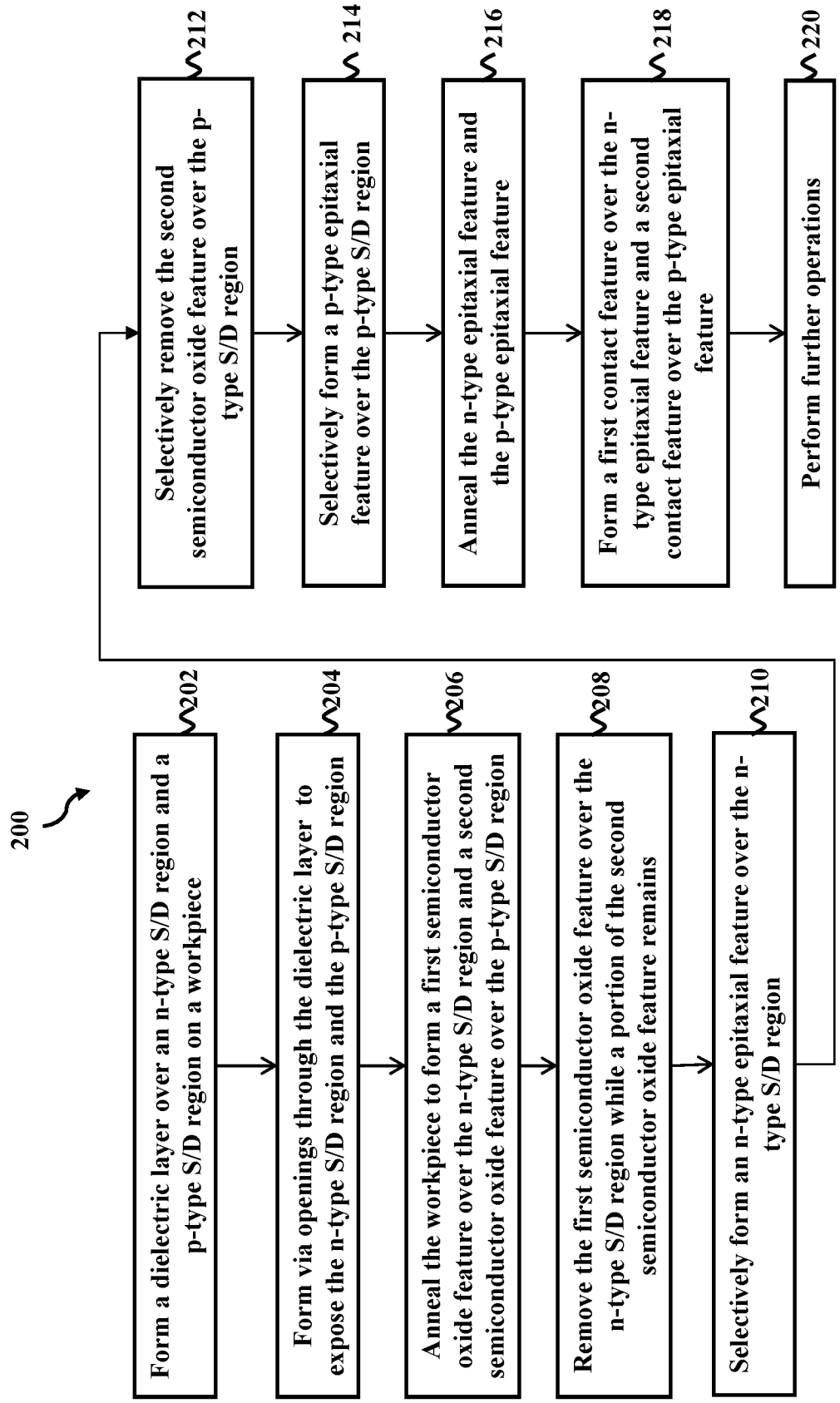
FIG. 2 is a flowchart illustrating a method of fabricating a semiconductor device on a workpiece according to embodiments of the present disclosure.

The various aspects of the present disclosure are discussed below in more detail with reference to the flow chart of a method 200 in FIG. 2 and fragmentary cross-sectional views of semiconductor devices on a workpiece 300 at various stages of fabrication in FIGS. 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, and 15B (hereafter FIGS. 3A-15B). FIGS. 3A-15B each illustrate a cross-sectional view along section A-A' as shown in FIG. 1. FIG. 2 is a flowchart illustrating the method 200 according to an embodiment of the present disclosure. The method 200 includes blocks 202, 204, 206, 208, 210, 212, 214, 216, 218, and 220. Additional steps can be provided before, during, and after method 200, and some of the steps described can be moved, replaced, or eliminated for additional embodiments of method 200. FIGS. 3A, 4A, 5A, 6A, 7A, 8A, 9A, 10A, 1A, 12A, 13A, 14A, and 15A each illustrates a cross-section view in an n-type device region 1000 of the workpiece 300. FIGS. 3B, 4B, 5B, 6B, 7B, 8B, 9B, 10B, 11B, 12B, 13B, 14B, and 15B each illustrate a cross-sectional view in a p-type device region 2000 of the workpiece 300.

Referring to FIGS. 2, 3A, 3B, 4A, 4B, 5A, and 5B, method 200 includes block 202 where a dielectric layer 320 is formed over an n-type source/drain region 310a and a p-type source/drain region 310b. Reference is first made to FIGS. 3A and 3B. A workpiece 300 is provided and the workpiece 300 includes a substrate 302, an isolation feature 304 over the substrate 302, a fin structure 306 rising from the isolation feature 304. The workpiece 300 includes an n-type device region 1000 shown in FIG. 3A and a p-type device region 2000 shown in FIG. 3B. The workpiece 300 includes the n-type source/drain region 310a in the n-type device region 1000 and the p-type source/drain region 310b in the p-type device region 2000. Besides the n-type and p-type source/drain regions 310a and 310b, the fin structures 306 also include one or more channel regions adjacent the n-type and p-type source/drain regions 310a and 310b. One or more first gate structures 312a are disposed over the channel regions of the fin structures 306 in the n-type device region 1000. One or more second gate structures 312b are disposed over the channel regions of the fin structures 306 in the p-type device region 2000. Each of the first gate structures 312a includes a gate dielectric layer 314, a first gate electrode 313a, a first spacer 315 and a second spacer 316. Each of the second gate structures 312b includes a gate dielectric layer 314, a second gate electrode 313b, a first spacer 315 and a second spacer 316. In some implementations, the first gate structure 312a and the second gate structure 312b are the same. In other implementations, the first gate structure 312a is different from the second gate structure 312b in that the first gate electrode 313a is different from the second gate electrode 313b at least in terms of work function layers contained therein.

The substrate 302 may be implemented as an embodiment of the substrate 102 discussed above with reference to FIG. 1. In some embodiments, the substrate 302 may include a portion of the fin structures 306. In some embodiments, the substrate 302 in the n-type device region 1000 includes a semiconductive material, including but not limited to crystal silicon (Si), silicon phosphide (SiP, or phosphorous-doped silicon), silicon carbide (SiC, or carbon-doped silicon), silicon phosphide carbide (SiPC, or phosphorous and carbon-doped silicon), or a III-V group material such as indium phosphide (InP), gallium arsenide (GaAs), aluminum arsenide (AAs), indium arsenide (InAs), indium aluminum arsenide (InAlAs), or indium gallium arsenide (InGaAs). In some embodiments, the substrate 302 in the p-type device region 2000 includes a semiconductive material, including but not limited to Si, silicon germanium (SiGe), boron-doped silicon germanium (SiGeB), germanium, or a III-V group material such as indium antimonide (InSb), gallium antimonide (GaSb), indium gallium antimonide (InGaSb).

An ion implantation process may be performed to implant a plurality of dopant ions to the substrate 302. The dopant ions may include an n-type dopant for the n-type device region 1000, for example arsenic (As) or phosphorous (P), or the dopant ions may include a p-type dopant for the p-type device region 2000, for example boron (B). After the implantation process is performed, a doping concentration level in the substrate 302 may be in a range from about $1\times10^{17}$ ions/cm$^3$ to about $5\times10^{19}$ ions/cm$^3$.

The n-type and p-type source/drain regions 310a and 310b have different material compositions or dopants. In some embodiments, the n-type source/drain region 310a may include silicon phosphide, silicon arsenide and silicon phosphide carbide, and the p-type source/drain region 310b may include boron-doped silicon germanium. In those embodiments, the n-type source/drain region 310a may be epitaxially formed and doped in situ with n-type dopants, such as phosphorous or arsenide; and the p-type source/drain region 310b may be epitaxially formed and doped in situ with p-type dopants, such as boron or gallium. In other embodiments, the n-type and p-type source/drain regions 310a and 310b may include the various materials of the substrate 302 of in the n-type device region 1000 or p-type device region 2000 discussed above, respectively. In some instances, the p-type source/drain region 310b may include boron doped silicon germanium where the germanium concentration is more than about 25%.

Reference is now made to FIGS. 4A and 4B. In some embodiments, before the dielectric layer 320 is deposited over the workpiece 300, a contact etch stop layer (CESL) 318 may be deposited over the n-type and p-type device regions 1000 and 2000, including over the n-type source/drain region 310a and the p-type source/drain region 310b. The CESL 318 may be formed of semiconductor nitride, such as silicon nitride, using ALD, CVD, or other suitable deposition method. In some embodiments represented in FIGS. 4A and 4B, the CESL 318 may be formed along sidewalls of the second spacer 316.

Figures 5A, 5B:
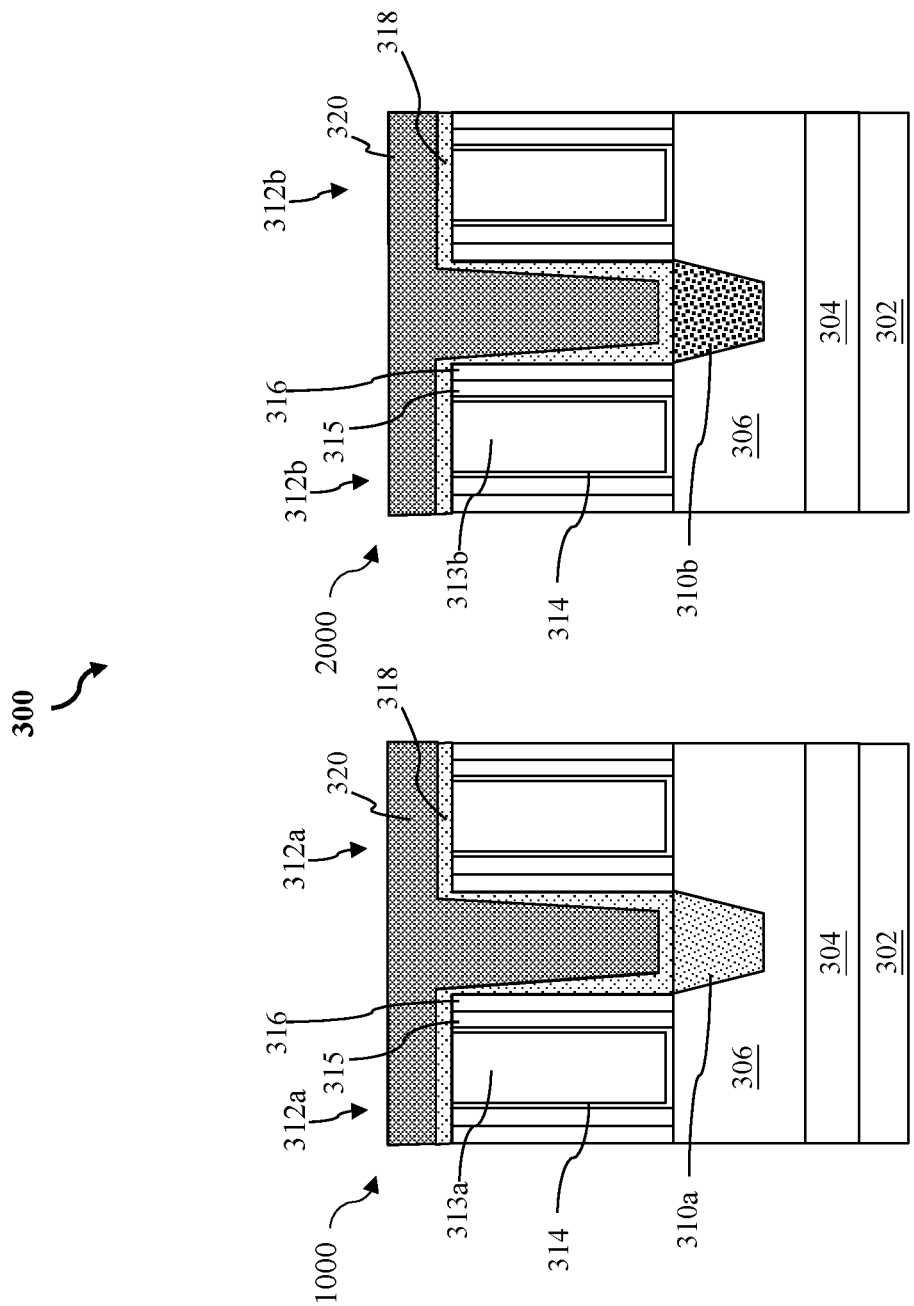

Referring now to FIGS. 5A and 5B, the dielectric layer 320 is then deposited over the workpiece 300, including on the CESL 318 (when formed). In some embodiments, the dielectric layer 320 may be an interlayer dielectric (ILD) layer and may be formed of a dielectric material, such as silicon oxide, tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In some implementations, the dielectric layer 320 may be formed over the workpiece 300 using CVD, flowable CVD (FCVD), or spin-on-glass. In some instances, block 202 may further include a planarization process to planarize a top surface of the dielectric layer 320 before further processes, such as those in block 204.

In some embodiments, the gate dielectric layer 314 may include a high-k dielectric material. A high-k dielectric material is a dielectric material having a dielectric constant that is greater than a dielectric constant of SiO$_2$, which is approximately 4. For example, the high-k dielectric material may include hafnium oxide (HfO$_2$), which has a dielectric constant that is in a range from approximately 18 to approximately 40. Alternatively, the high-k material may include one of ZrO, Y$_2$O$_3$, La$_2$O$_5$, Gd$_2$O$_5$, TiO$_2$, Ta$_2$O$_5$, HfErO, HfLaO, HfYO, HfGdO, HfAlO, HfZrO, HTiO, HfTaO, SrTiO, or combinations thereof. In some implementations, an interfacial layer, such as a silicon oxide layer, may be formed between the channel region and the high-k dielectric material to improve bonding between the two.

Each of the first gate electrode 313a and the second gate electrode 313b includes a work function metal component and a fill metal component. The work function metal component tunes a work function of the respective transistor device (e.g., either in the n-type device region 1000 or the p-type device region 2000) so that a desired threshold voltage Vt is achieved. The fill metal component of the first and second gate electrodes 313a and 313b serves as the main conductive portion and may include tungsten, aluminum, copper, or combinations thereof. For the sake of simplicity, the work function metal component, and the fill metal component of each of the first and second gate electrode 313a and 313b are not separately drawn in the figures herein.

In the gate-replacement process, a dummy gate electrode (e.g., made of polysilicon) may be formed on the high-k dielectric layer. After the formation of the n-type and p-type source/drain regions 310a and 310b, the dummy gate electrode may be removed and replaced by the first/second gate electrodes 313a/313b discussed above. This is referred to as a gate-last process flow. In some embodiments, the gate-replacement process may also employ a high-k last process flow, in which a dummy oxide dielectric is formed in place of the high-k dielectric. A dummy polysilicon gate electrode is formed on the dummy oxide gate dielectric. After the formation of the n-type and p-type source/drain regions 310a and 310b, the dummy oxide gate dielectric is removed along with the dummy polysilicon gate electrode. The high-k gate dielectric and the metal gate electrode may then be formed to replace the removed dummy gate dielectric and dummy gate electrode.

The n-type device region 1000 and the p-type device region 2000 each include first and second spacers 315 and 316 that are disposed on sidewalls of the first/second gate structures 312a/312b. The first and second spacers 315 and 316 may include silicon nitride, silicon carbonitride, silicon oxynitride, silicon oxycarbonitride, or other suitable dielectric materials. In some embodiments, the first spacer 315 and second spacer 316 may be formed of different dielectric materials. In alternative processes not separately illustrated in FIGS. 3A, 3B, 4A, 4B, 5A, and 5B, the first and second gate structures 312a and 312b may each further include a metal capping layer and/or a self-aligned contact (SAC) dielectric layer on the first/second gate electrode 313a/313b.

Referring now to FIGS. 2, 6A and 6B, the method 200 includes a block 204 where a first via opening 322a and a second via opening 322b may be formed through the dielectric layer 320 and the CESL 318 to expose the n-type source/drain region 310a and the p-type source/drain region 310b, respectively. In some embodiments, a reactive ion etching (RIE) may be used to directionally etch the first via opening 322a through the dielectric layer 320 to expose the n-type source/drain region 310a and to directionally etch the second via opening 322b through the dielectric layer 320 to expose the p-type source/drain region 310b. In some other embodiments, suitable dry etch techniques other than RIE may be used for block 204. Because the n-type source/drain region 310a and the p-type source/drain region 310b have to be exposed at block 204, they inevitably suffer damages or volume loss. Therefore, in some embodiments, the first via opening 322a extends partially into the n-type source/drain region 310a and the second via opening 322b extends partially into the p-type source/drain region 310b. In some implementations shown in FIGS. 6A and 6B, a portion of the CESL 318 may remain on and extend along sidewalls of the second spacer 316.

Figures 7A, 7B:
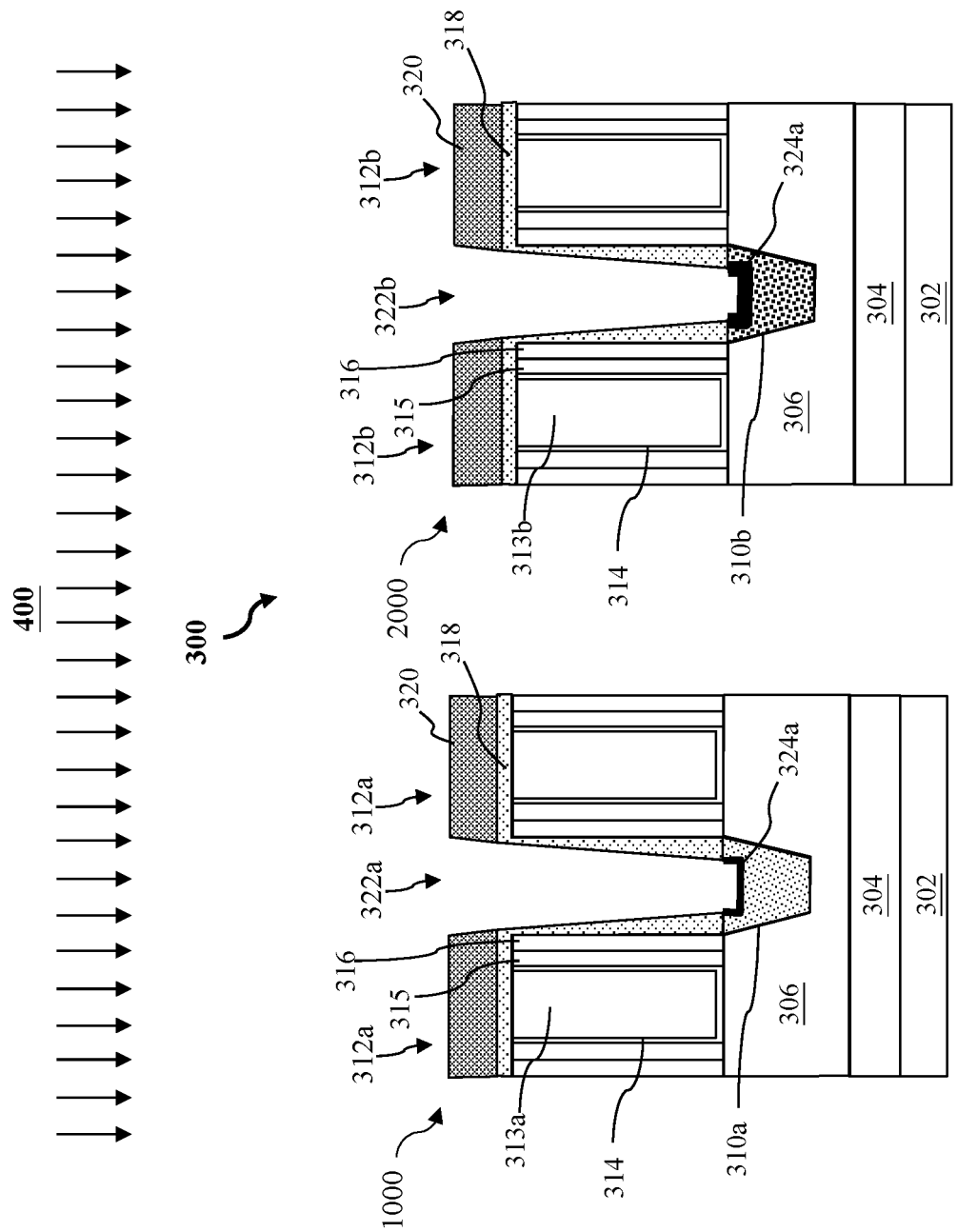

Referring now to FIGS. 2, 7A and 7B, the method 200 includes a block 206 where the workpiece 300 is annealed in a first anneal process 400 to form a first semiconductor oxide feature 324a over the n-type source/drain region 310a and a second semiconductor oxide feature 324b over the p-type source/drain region 310b. At block 206, oxidizers such as oxygen or water may be introduced in the reaction chamber, such as a CVD chamber, to oxidize the n-type source/drain region 310a and the p-type source/drain region 310b. In some embodiments, the n-type source/drain region 310a is formed of n-type dopant doped silicon such as phosphorous-doped silicon, arsenic-doped silicon or phosphorous and carbon-doped silicon and is oxidized during the first anneal process 400 to form phosphorous-doped silicon oxide, arsenic-doped silicon oxide, or phosphorous and carbon-doped silicon oxide. The p-type source/drain region 310b is formed of p-type dopant doped silicon germanium such as boron-doped silicon germanium and is oxidized during the first anneal process 400 to form boron-doped silicon germanium oxide. In some embodiments, the first anneal process 400 includes a temperature range between about 250° C. and about 500° C., which is lower than the temperature conventionally adopted for thermal oxidization. In some implementations, the first anneal process 400 may last between about 10 mins and about 24 hours. The relatively low anneal temperature of the first anneal process 400 is selected for two reasons. First, semiconductor oxides formed at this low temperature range can be more consistent and uniform. Second, higher temperature ranges, such as one above 500° C., have a tendency to exceed the thermal budget and harm the first and second gate structures 312a and 312b. In some examples, the first anneal process 400 may include a temperature between about 400° C. and about 450° C. and lasts for about 2 hours. In some implementations, the first anneal process 400 does not utilize rapid thermal anneal (RTA) or laser annealing (LSA). Because the n-type source/drain region 310a and the p-type source/drain region 310b are simultaneously oxidized at block 206, the operations at block 206 may be referred to as an oxidization step.

It has been observed that the presence of Ge enhances oxidation rate and allows the p-type source/drain region 310b to oxidize at least two times quicker than the n-type source/drain region 310a. In some embodiments, a thickness of the second semiconductor oxide feature 324b is between about 2 and about 4 times of a thickness of the first semiconductor oxide feature 324a. In embodiments where the first semiconductor oxide feature 324a includes phosphorus-doped silicon oxide and the second semiconductor oxide feature 324b includes boron-doped silicon germanium oxide, the first semiconductor oxide feature 324a has a thickness of about 2 nm and the second semiconductor oxide feature 324b has a thickness of about 4.5 nm.

Referring now to FIGS. 2, 8A and 8B, the method 200 includes a block 208 where the first semiconductor oxide feature 324a over the n-type source/drain region 310a is removed while a portion of the second semiconductor oxide feature 324b remains over the p-type source/drain region 310b. In some embodiments, the workpiece 300 may be subject to a pre-clean process that may be a dry etch or a wet etch. In some implementations, the dry etch at block 208 may utilize nitrogen trifluoride and ammonia. In some implementations, the wet etch at block 208 may utilize diluted hydrogen fluoric acid (DHF) solution, which may include a mixture of hydrofluoric acid and deionized water (DI water) of a dilution ratio between about 1:500 and about 1:100. It has been observed that both the first semiconductor oxide feature 324a and the second semiconductor oxide feature 324b experience substantially identical etch rate in the pre-clean process. Because the second semiconductor oxide feature 324b is between about 2 and about 4 times thicker than the first semiconductor oxide feature 324a, the first semiconductor oxide feature 324a may be completely removed while the p-type source/drain region 310b remains covered by a remaining portion of the second semiconductor oxide feature 324b. In some instances, upon conclusion of block 208, the second semiconductor oxide feature 324b may be about 2 nm thick, measured from the p-type source/drain region 310b. As will be described below, the second semiconductor oxide feature 324b will function as a blocking layer to block formation of the n-type epitaxial feature 326a.

Referring now to FIGS. 2, 9A and 9B, the method 200 includes a block 210 where an n-type epitaxial feature 326a is selectively formed over the n-type source/drain region 310a. In some embodiments, the n-type epitaxial feature 326a may be epitaxially formed using a cyclic deposition and etch (CDE) method or a co-flow method. In implementations where the CDE method is used, a cycle of deposition, purge, etch, and purge may be repeated for a suitable number of times. In the deposition phase, silicon precursors (such as $SiH_4$, $Si_2H_6$, or $Si_3H_8$) and dopant gases (such as $PH_3$) are directed to a CVD chamber for phosphorous-doped silicon growth, which includes epitaxy of silicon and in-situ phosphorous doping. After the deposition phase, the gases introduced during the deposition phase are purged. In the etch phase, etchant gases such as hydrogen chloride (HCl) and/or chlorine ($Cl_2$) may be introduced into the CVD chamber to remove amorphous phosphorous-doped silicon formed on dielectric surfaces, such as surfaces of the spacer and the second semiconductor oxide feature 324b. After the etch phase, the gas introduced during the etch phase are purged and the cycle may repeat again. In implementations where the co-flow method is used, silicon precursors, dopant gases and the etchant gases are directed into the CVD chamber to simultaneously deposit the n-type epitaxial feature 326a and remove amorphous n-type epitaxial feature 326a formed on dielectric surfaces and the second semiconductor oxide feature 324b. The n-type epitaxial feature 326a may be referred to as an n-type epitaxial capping layer 326a.

Figure 16:
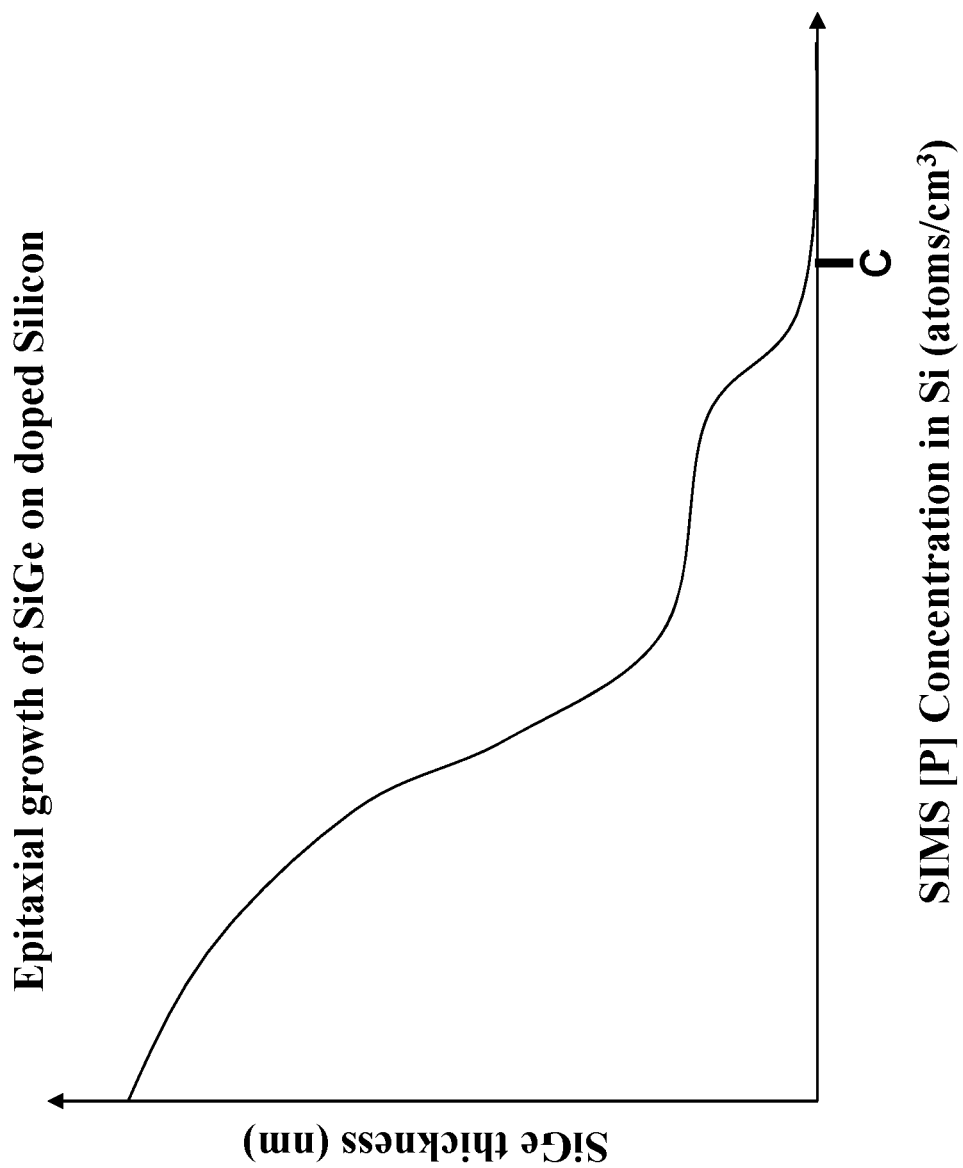
FIG. 16 illustrates thicknesses of epitaxial silicon germanium layers on silicon surfaces doped with phosphorous at different concentrations according to experimental results.

In some embodiments, the flow rate of the dopant gases, such as $PH_3$, is controlled such that the concentration of the n-type dopant in the n-type epitaxial feature 326a is at or exceeds a threshold n-type dopant concentration C between about 7E+21 ($7\times10^{21}$) atoms per cubic centimeter (atoms/$cm^3$) and about 1.5E+22 ($1.5\times10^{22}$) atoms/$cm^3$. Reference is now made to FIG. 16. A series of experiments and measurements have been carried out on epitaxial formation of a SiGe film on n-type dopant doped silicon, where the germanium concentration is between about 30% and about 75%. In the series of experiments and measurements, the concentration of the n-type dopant (phosphorous in this case) is measured by secondary ion mass spectrometry (SIMS) and precursor gases include hydrogen chloride, dichlorosilane (DCS), germanium (IV) hydride, and hydrogen. As shown in FIG. 16, the thickness of the SiGe film epitaxially formed thereon decreases as the n-type dopant (e.g. phosphorous) concentration in the silicon film increases. At or beyond a threshold n-type dopant (e.g. phosphorous) concentration C, the thickness of the SiGe film may substantially drop to zero. As this selective epitaxial growth (or non-growth) originates from lattice mismatch brought about by germanium, the germanium concentration in the SiGe film cannot be lower than 30%. In addition, it has been observed that when germanium concentration in the SiGe film is greater than 75%, the SiGe film may become too defective for processes that follow. Depending on the germanium concentration in the SiGe film within the range between about 30% and about 75%, the threshold n-type dopant (e.g. phosphorous) concentration C may be between about 7E+21 ($7\times10^{21}$) atoms/$cm^3$ and about 1.5E+22 ($1.5\times10^{22}$) atoms/$cm^3$. In an example where the germanium concentration in SiGe is 50%, the threshold concentration C of phosphorous is about 1E+22 atoms/$cm^3$. When the n-type dopant concentration in silicon is at or exceeds the threshold n-type dopant concentration C, no or substantially no SiGe film may be formed thereon. The threshold n-type dopant concentration C may be greater than the maximum solubility of the n-type dopant in silicon. For example, the maximum solid solubility of phosphorous in silicon is $1.3\times10^{21}$ atoms/$cm^3$ while the lower bound of the threshold n-type dopant concentration is $7\times10^{21}$ atoms/$cm^3$.

Figures 10A, 10B:
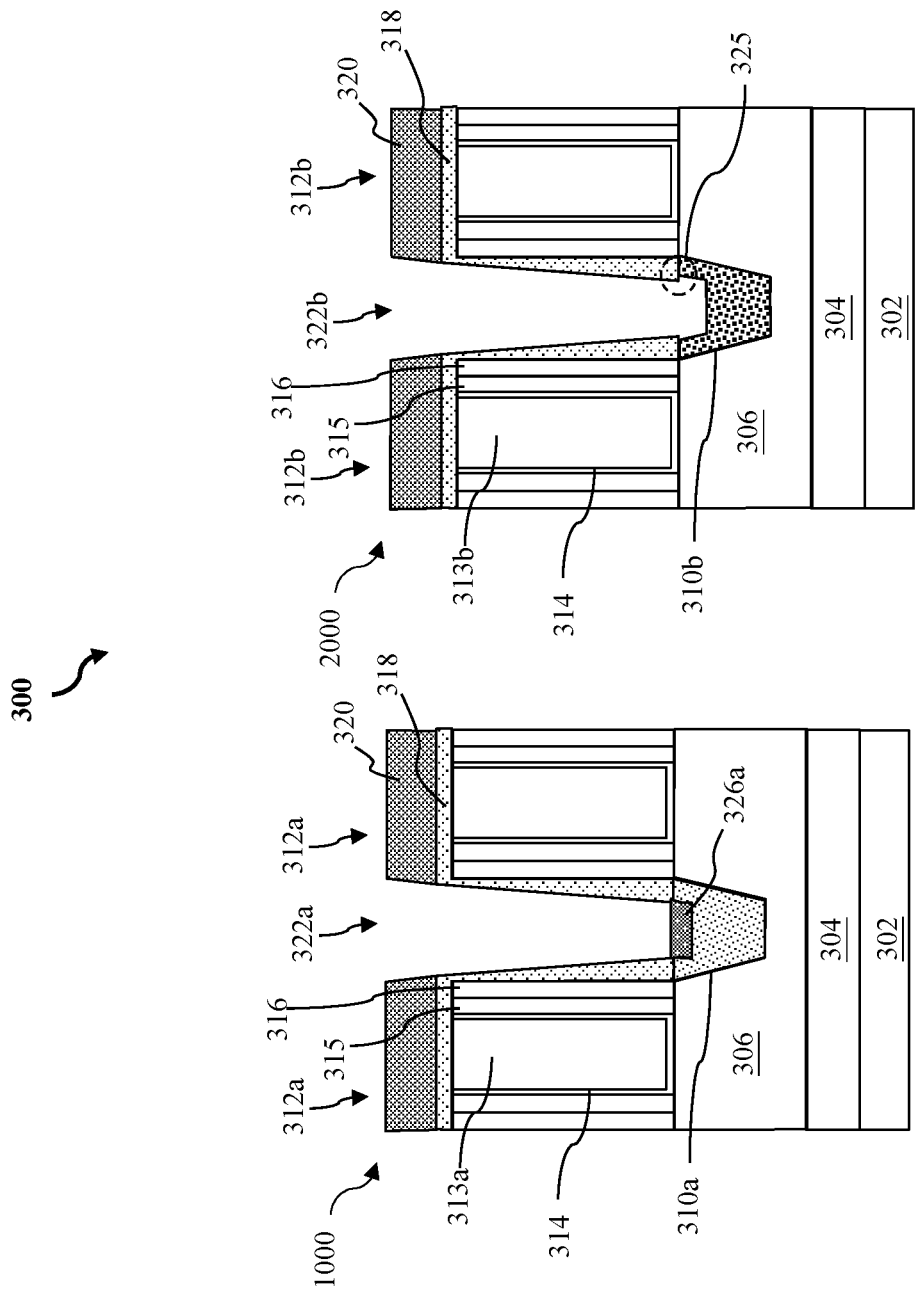

Referring now to FIGS. 2, 10A and 10B, the method 200 includes a block 212 where the second semiconductor oxide feature 324b over the p-type source/drain region 310b is selectively removed. In some embodiments, at block 212, the workpiece 300 may be subject to the pre-clean process described above with respect to the block 208 above. The pre-clean process may be a dry etch or a wet etch. The dry etch may utilize nitrogen trifluoride and ammonia and the wet etch may utilize diluted hydrogen fluoric acid (DHF) solution, which may include a mixture of hydrofluoric acid and deionized water (DI water) of a dilution ratio between about 1:500 and about 1:100. The pre-clean process etches the second semiconductor oxide feature 324b faster than it etches the n-type epitaxial feature 326a. It allows the operations at block 212 to completely remove the second semiconductor oxide feature 324b while only a portion of the n-type epitaxial feature 326a is etched, as representatively illustrated in FIGS. 10A and 10B. Because the formation of the second semiconductor oxide feature 324b consumes the material in the p-type source/drain region 310b and the removal of the second semiconductor oxide feature 324b may remove a portion of the p-type source/drain region 310b, the operations at block 212 may cause an undercut 325 (shown in dotted circles in FIG. 10B) below the portion of the CESL 318 that extends along sidewalls of the second spacer 316.

Figures 11A, 11B:
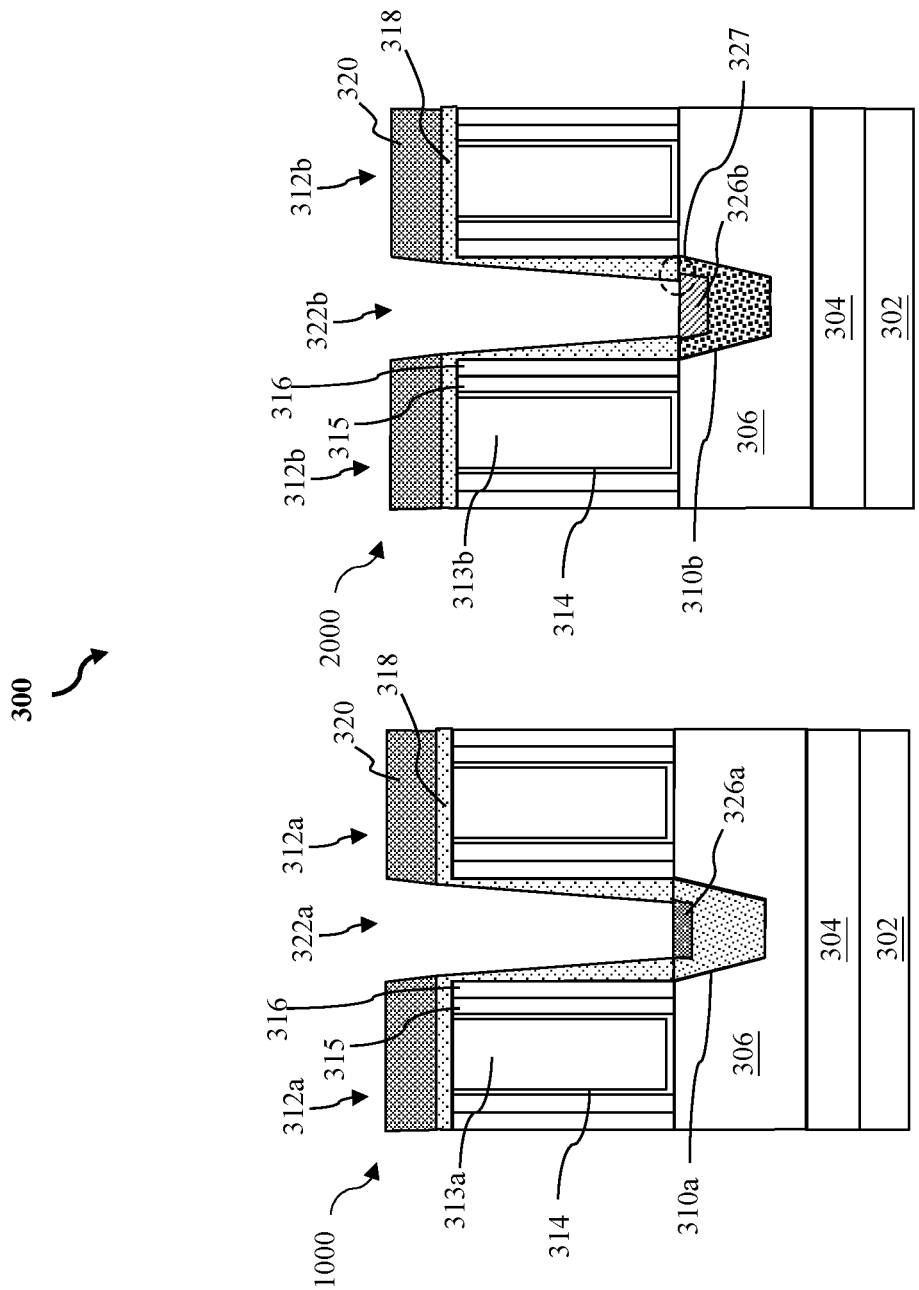

Referring now to FIGS. 2, 11A and 11B, the method 200 includes a block 214 where a p-type epitaxial feature 326b is selectively formed over the p-type source/drain region 310b. As described above, the p-type epitaxial feature 326b does not form well on dielectric layers, such as the dielectric layer 320 and CESL 318. In addition, the n-type epitaxial feature 326a includes an n-type dopant concentration greater than the threshold n-type dopant concentration C and functions as a blocking layer to prevent formation of the p-type epitaxial feature 326b thereon. Therefore, at block 214, the p-type epitaxial feature 326b can be selectively formed over the p-type source/drain region 310b. The p-type epitaxial feature 326b may be referred to as a p-type epitaxial capping layer 326b. In some embodiments represented in FIG. 11B, the p-type epitaxial feature 326b formed at block 214 may extend into the undercut 325 shown in FIG. 10B to form an edge portion 327 (shown in dotted circles in FIG. 11B) that is disposed under the portion of the CESL 318 that extends along the sidewalls of the second spacer 316.

In some embodiments, the p-type epitaxial feature 326b may be epitaxially formed using a cyclic deposition and etch (CDE) method or a co-flow method. In implementations where the CDE method is used, a cycle of deposition, purge, etch, and purge may be repeated for a suitable number of times. In the deposition phase, silicon precursors (such as $SiH_4$, $Si_2H_6$, or $Si_3H_8$), germanium precursors ($GeH_4$) and dopant gases (such as $B_2H_6$) are directed to a CVD chamber for boron-doped silicon germanium growth, which includes epitaxy of silicon germanium and in-situ boron doping. After the deposition phase, the gases introduced during the deposition phase are purged. In the etch phase, etchant gases such as hydrogen chloride (HCl) and/or chlorine (Cl$_2$) may be introduced into the CVD chamber to remove amorphous boron-doped silicon germanium formed on dielectric surfaces, such as surfaces of the spacer and the second semiconductor oxide feature 324b. After the etch phase, the gas introduced during the etch phase are purged and the cycle may repeat again. In implementations where the co-flow method is used, silicon precursors, germanium precursors, dopant gases, and the etchant gases are directed into the CVD chamber to simultaneously deposit the p-type epitaxial feature 326b and remove amorphous p-type epitaxial feature 326b formed on the dielectric surfaces.

Figures 12A, 12B:
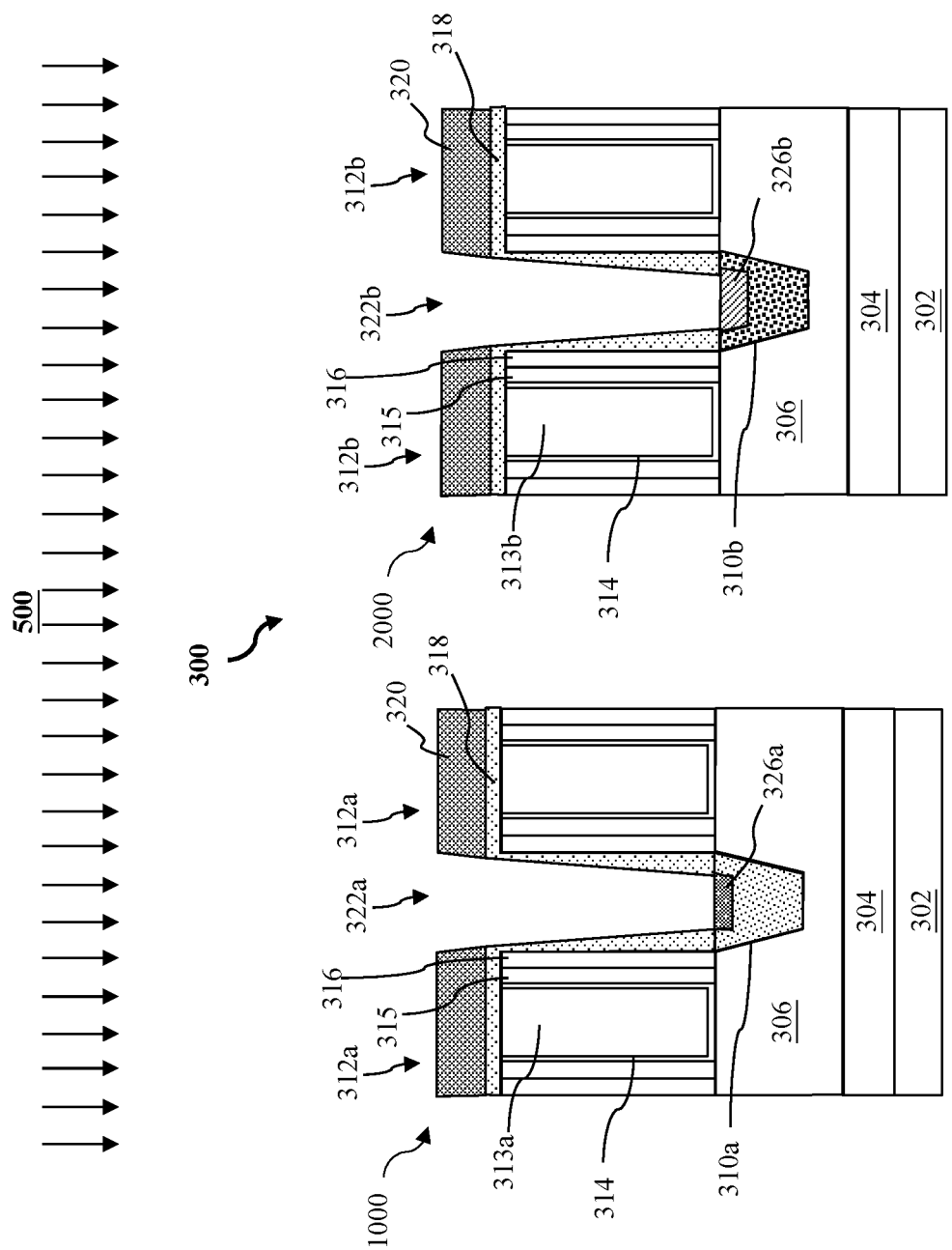

Referring now to FIGS. 2, 12A and 12B, the method 200 includes a block 216 where the n-type epitaxial feature 326a and the p-type epitaxial feature 326b are annealed in a second anneal process 500. At block 216, the n-type epitaxial feature 326a and the p-type epitaxial feature 326b are annealed to activate the n-type dopant in the n-type epitaxial feature 326a and the p-type dopant in the p-type epitaxial feature 326b. In some embodiments, unlike the first anneal process 400, the second anneal process 500 is a rapid process such as a rapid thermal anneal (RTA) and laser annealing (LSA). In some implementations, the second anneal process 500 includes a short anneal time, which is measured by seconds, and an anneal temperature higher than the anneal temperature of the first anneal process 400.

Figures 13A, 13B:
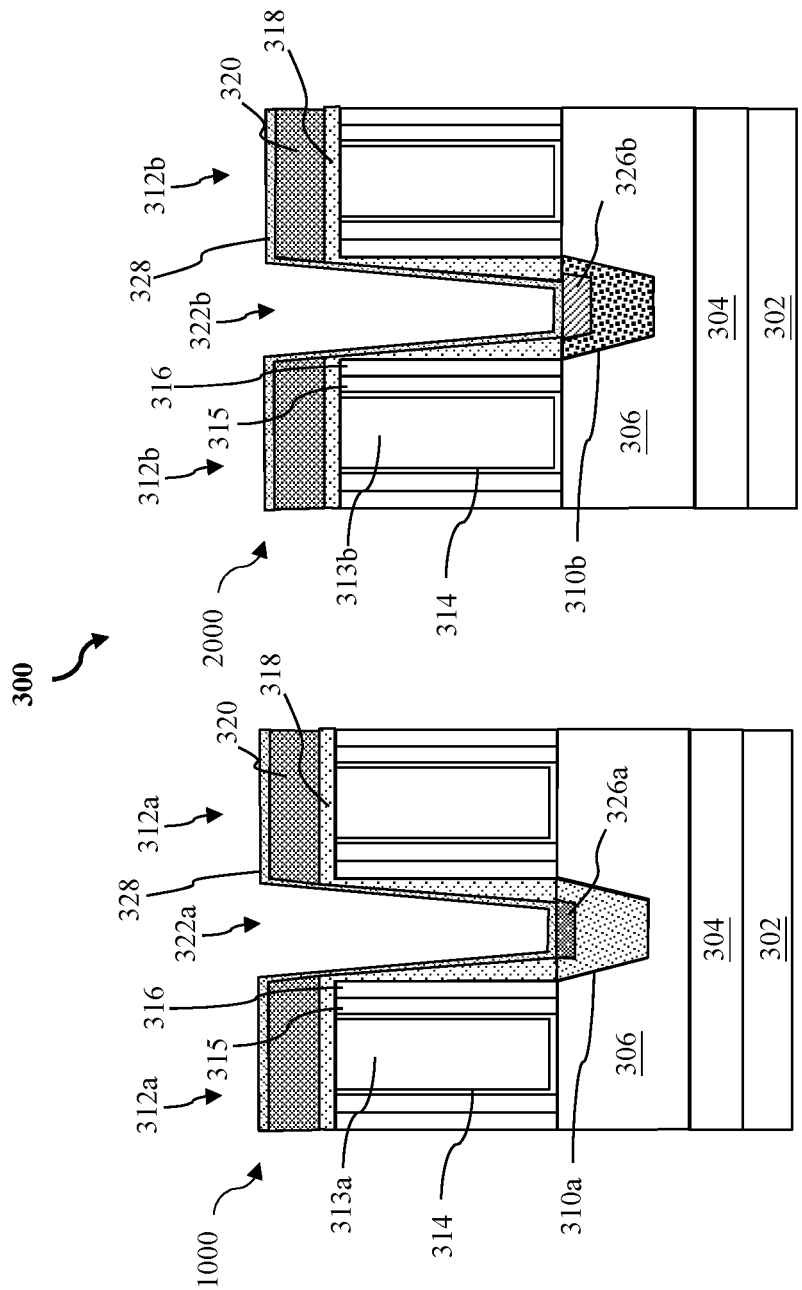

Referring now to FIGS. 2, 13A, 13B, 14A, 14B, 15A, and 15B, the method 200 includes a block 218 where contact features 332 are formed over the n-type epitaxial feature 326a and the p-type epitaxial feature 326b. Reference is first made to FIGS. 13A and 13B. In some embodiments, a barrier layer 328 may be deposited over the workpiece 300, including in the first via opening 322a and the second via opening 322b. In those embodiments, the barrier layer 328 is disposed on the n-type epitaxial feature 326a, the p-type epitaxial feature 326b, the CESL 318, and the dielectric layer 320 and functions to prevent oxygen diffusion into the metal fill layer 330 (described below) to be deposited in the first and second via openings 322a and 322b over the barrier layer 328. In some implementations, the barrier layer 328 may be formed of a metal nitride, such as titanium nitride, tantalum nitride, cobalt nitride, ruthenium nitride, or tungsten nitride. In some instances, after the deposition of the barrier layer 328, the workpiece 300 may be annealed to bring about silicidation reaction at the interface between the barrier layer 328 and the n-type epitaxial feature 326a and the p-type epitaxial feature 326b to form a metal silicide at the interface. Such metal silicide may include titanium silicide, tantalum silicide, cobalt silicide, tungsten silicide, ruthenium silicide, titanium germanide, tantalum germanide, cobalt germanide, ruthenium germanide, or tungsten germanide. In some instances, the annealing of the barrier layer 328 is an anneal process separate from the second anneal process 500. In some other instances, the second anneal process 500 may take place after the formation of the barrier layer 328 such that the second anneal process 500 not only activates dopants in the n-type epitaxial feature 326a and p-type epitaxial feature 326b but also bring about the silicidation reaction described above. In some alternative embodiments, the formation of the barrier layer 328 is omitted and no barrier layer comes between the workpiece 300 and the metal fill layer for the contact features 332. In those alternative embodiments, the contact features may be referred to as barrier-free and may include tungsten or ruthenium.

Figures 14A, 14B:
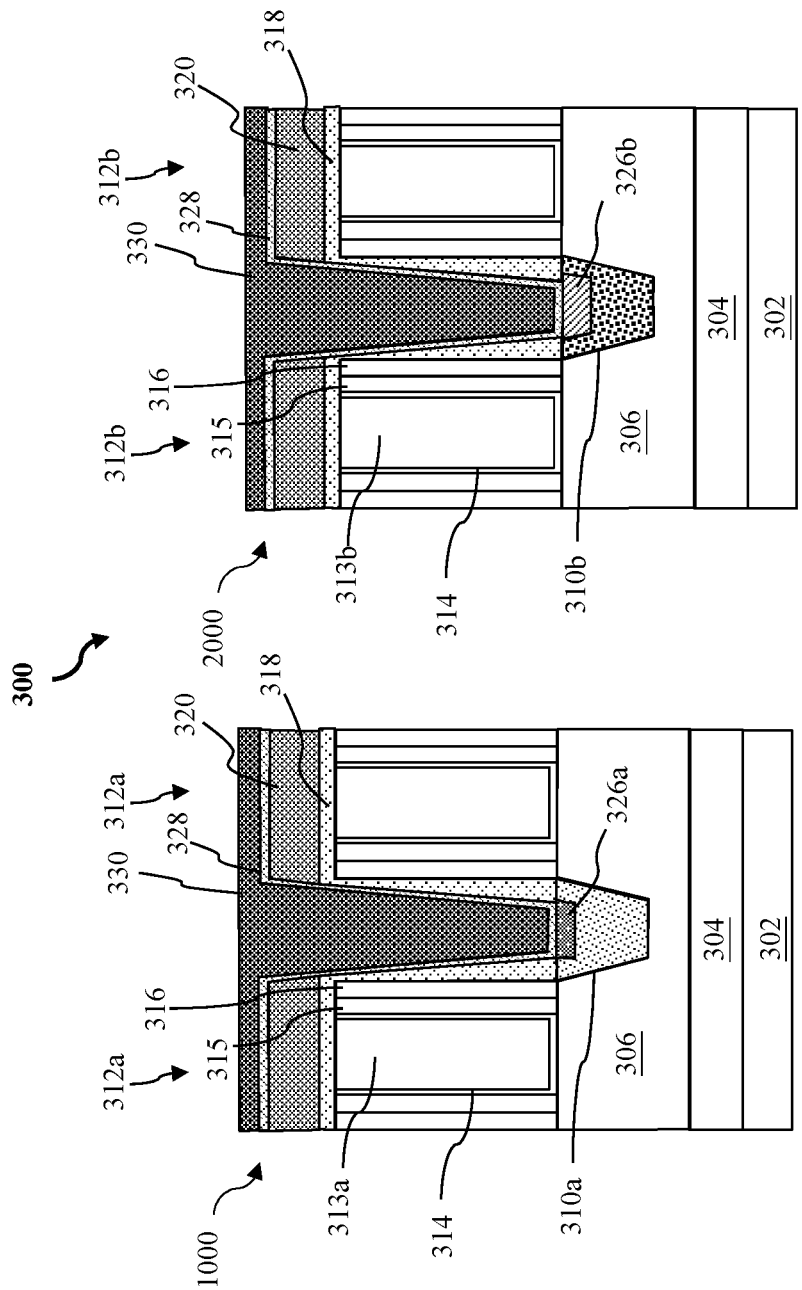

Reference is now made to FIGS. 14A and 14B. A metal fill layer 330 is deposited over the workpiece 300, including in the first via opening 322a and the second via opening 322b. In embodiments where the barrier layer 328 is formed, the metal fill layer 330 is deposited over the barrier layer 328. The metal fill layer 330 may be formed of copper, cobalt, nickel, tungsten, ruthenium, aluminum, alloys thereof, or other suitable metals. The metal fill layer 330 may be deposited using CVD, PVD, or ALD. After the metal fill layer 330 is deposited, the workpiece 300 is planarized by chemical mechanical polishing (CMP) or other suitable planarization techniques. As shown in FIGS. 15A and 15B, excess barrier layer 328 and the metal fill layer 330 deposited over the dielectric layer 320 are removed and top surfaces of the dielectric layer 320, the barrier layer 328, and the metal fill layer 330 are coplanar. At this point, the contact features 332 are formed. In some instances, the contact features 332 may also be referred to as source/drain contacts 332.

Referring now to FIG. 2, the method 200 includes a block 220 where further operations are performed. Such further operations may include, for example, formation of a back-end-of-line (BEOL) interconnect structure. The interconnect structure may include one or more interlayer dielectric (ILD) layers, one or more contact vias, and one or more metal line layers.

Based on the above discussions, it can be seen that the present disclosure offers advantages over conventional processes. It is understood, however, that other embodiments may offer additional advantages, and not all advantages are necessarily disclosed herein, and that no particular advantage is required for all embodiments. One advantage is that the processes disclosed in the present disclosure utilizes different oxidization rates of different semiconductor materials to regrow n-type epitaxial feature in the n-type source/drain region while the semiconductor oxide over the p-type source/drain region functions as a blocking layer for the n-type epitaxial feature. Another advantage is that the process of the present disclosure describes a critical threshold dopant concentration in the n-type epitaxial feature such that the n-type epitaxial feature may serve as a blocking layer for the p-type epitaxial feature while the p-type epitaxial feature is selectively formed over the p-type source/drain region. The separate regrowth of epitaxial features remedies volume loss of epitaxial feature during via opening formation and does not require additional lithography processes. Other advantages include compatibility with existing fabrication processes. Therefore, the present disclosure is easy and convenient to implement.

One aspect of the present disclosure pertains to a method of fabricating a semiconductor device. The method includes providing a workpiece including a first source/drain region in a first device region and a second source/drain region in a second device region, depositing a dielectric layer over the first source/drain region and the second source/drain region, forming a first via opening in the dielectric layer to expose the first source/drain region and a second via opening in the dielectric layer to expose the second source/drain region, annealing the workpiece to form a first semiconductor oxide feature over the exposed first source/drain region and a second semiconductor oxide feature over the exposed second source/drain region, removing the first semiconductor oxide feature to expose the first source/drain region in the first via opening in dielectric layer, and selectively forming a first epitaxial feature over the exposed first source/drain region.

In some embodiments, the method further includes removing the second semiconductor oxide feature to expose the second source/drain region in the second via opening in the dielectric layer, and selectively forming a second epitaxial feature over the exposed second source/drain region. In some embodiments, the removing of the first semiconductor oxide feature includes partially removing the second semiconductor oxide feature. In some embodiments, the second semiconductor oxide feature is disposed over the second source/drain region during the selectively forming of the first epitaxial feature. In some implementations, the selectively forming of the first epitaxial feature includes epitaxially forming the first epitaxial feature using a silicon-containing precursor, and in situ doping the first epitaxial feature with an n-type dopant at a concentration greater than a threshold n-type dopant (e.g. phosphorous) concentration between about $7\times10^{21}$ atoms/cm$^3$ and about $1.5\times10^{22}$ atoms/cm$^3$, wherein the n-type dopant includes phosphorous or arsenide. In some instances, the first semiconductor oxide feature includes silicon, phosphorous and oxygen and the second semiconductor oxide feature includes silicon, germanium, boron, and oxygen. In some implementations, the annealing includes forming the first semiconductor oxide feature to a first thickness, and forming the second semiconductor oxide feature to a second thickness. The first thickness is smaller than the second thickness.

Another one aspect of the present disclosure pertains to a method. The method includes forming a first via opening in a dielectric layer to expose a first source/drain region, forming a second via opening in the dielectric layer to expose a second source/drain region, simultaneously oxidizing the first source/drain region to form a first oxide feature over the first source/drain region and the second source/drain region to form a second oxide feature over the second source/drain region, removing the first oxide feature to expose the first source/drain region, selectively forming a first epitaxial feature over the first source/drain region using a portion of the second oxide feature as a first blocking layer, removing the second oxide feature to expose the second source/drain region, and selectively forming a second epitaxial feature over the second source/drain region using the first epitaxial feature as a second blocking layer.

In some embodiments, the first source/drain region is an n-type source/drain region, the second source/drain region is a p-type source/drain region, the first oxide feature includes silicon, phosphorous and oxygen, and the second oxide feature includes silicon, germanium, boron, and oxygen. In some implementations, the simultaneously oxidizing of the first source/drain region and the second source/drain region forms the first oxide feature to a first thickness and the second oxide feature to a second thickness, and the second thickness is between about 1.5 and about 3.0 times of the first thickness. In some embodiments, the removing of the first oxide feature, the forming of the first epitaxial feature, the removing of the second oxide feature, and the forming of the second epitaxial feature do not include a photolithography step. In some implementations, the simultaneously oxidizing of the first source/drain region and the second source/drain region includes annealing the first source/drain region and the second source/drain region at a temperature smaller than 500° C. In some embodiments, the second source/drain region includes silicon, germanium and boron and a content of germanium in the second source/drain region is greater than 25%. In some instances, the removing of the first oxide feature includes etching the first and second oxide features simultaneously. In some embodiments, the simultaneously oxidizing of the first source/drain region and the second source/drain region is after the forming of the first via opening and the forming of the second via opening. In some implementations, the selectively forming of the first epitaxial feature does not form the first epitaxial feature over the first blocking layer and the selectively forming of the second epitaxial feature does not form the second epitaxial feature over the second blocking layer.

Yet another aspect of the present disclosure pertains to a semiconductor device. The semiconductor device includes an n-type device region comprising a first source/drain region and a first source/drain capping layer over the first source/drain feature, and a p-type device region including a second source/drain region and a second source/drain capping layer over the second source/drain feature. The first source/drain capping layer includes silicon doped with an n-type dopant at a concentration greater the maximum solid solubility of the n-type dopant in silicon. In some embodiments, the n-type dopant is phosphorous. In some implementations, the concentration is between about $7\times10^{21}$ atoms/cm$^3$ and about $1.5\times10^{22}$ atoms/cm$^3$. In some instances, the p-type device region further includes a contact etch stop layer disposed over a portion of the second source/drain region and a portion of the second source/drain capping layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method of fabricating a semiconductor device, comprising:
    providing a workpiece comprising a first source/drain region in a first device region and a second source/drain region in a second device region;
    depositing a dielectric layer over the first source/drain region and the second source/drain region;
    forming a first via opening in the dielectric layer to expose the first source/drain region and a second via opening in the dielectric layer to expose the second source/drain region;
    annealing the workpiece to form a first semiconductor oxide feature over the exposed first source/drain region and a second semiconductor oxide feature over the exposed second source/drain region;
    removing the first semiconductor oxide feature to expose the first source/drain region in the first via opening in dielectric layer; and
    selectively forming a first epitaxial feature over the exposed first source/drain region.

2. The method of claim 1, further comprising:
    removing the second semiconductor oxide feature to expose the second source/drain region in the second via opening in the dielectric layer; and selectively forming a second epitaxial feature over the exposed second source/drain region.

3. The method of claim 1, wherein the removing of the first semiconductor oxide feature comprises partially removing the second semiconductor oxide feature.

4. The method of claim 1, wherein the second semiconductor oxide feature is disposed over the second source/drain region during the selectively forming of the first epitaxial feature.

5. The method of claim 1, wherein the selectively forming of the first epitaxial feature comprises:
epitaxially forming the first epitaxial feature using a silicon-containing precursor; and
in situ doping the first epitaxial feature with an n-type dopant at a concentration greater than a threshold n-type dopant (e.g. phosphorous) concentration between about $7 \times 10^{21}$ atoms/cm$^3$ and about $1.5 \times 10^{22}$ atoms/cm$^3$, wherein the n-type dopant comprises phosphorous or arsenide.

6. The method of claim 1, wherein the first semiconductor oxide feature comprises silicon, phosphorous and oxygen and the second semiconductor oxide feature comprises silicon, germanium, boron, and oxygen.

7. The method of claim 1, wherein the annealing comprises:
forming the first semiconductor oxide feature to a first thickness; and
forming the second semiconductor oxide feature to a second thickness,
wherein the first thickness is smaller than the second thickness.

8. A method, comprising:
forming a first via opening in a dielectric layer to expose a first source/drain region;
forming a second via opening in the dielectric layer to expose a second source/drain region;
simultaneously oxidizing the first source/drain region to form a first oxide feature over the first source/drain region and the second source/drain region to form a second oxide feature over the second source/drain region;
removing the first oxide feature to expose the first source/drain region;
selectively forming a first epitaxial feature over the first source/drain region using a portion of the second oxide feature as a first blocking layer;
removing the second oxide feature to expose the second source/drain region; and
selectively forming a second epitaxial feature over the second source/drain region using the first epitaxial feature as a second blocking layer.

9. The method of claim 8,
wherein the first source/drain region is an n-type source/drain region,
wherein the second source/drain region is a p-type source/drain region,
wherein the first oxide feature comprises silicon, phosphorous and oxygen,
wherein the second oxide feature comprises silicon, germanium, boron, and oxygen.

10. The method of claim 8,
wherein the simultaneously oxidizing of the first source/drain region and the second source/drain region forms the first oxide feature to a first thickness and the second oxide feature to a second thickness,
wherein the second thickness is between about 1.5 and about 3.0 times of the first thickness.

11. The method of claim 8, wherein the removing of the first oxide feature, the forming of the first epitaxial feature, the removing of the second oxide feature, and the forming of the second epitaxial feature do not include a photolithography step.

12. The method of claim 8, wherein the simultaneously oxidizing of the first source/drain region and the second source/drain region comprises annealing the first source/drain region and the second source/drain region at a temperature smaller than 500° C.

13. The method of claim 8,
wherein the second source/drain region comprises silicon, germanium and boron,
wherein a content of germanium in the second source/drain region is greater than 25%.

14. The method of claim 8, wherein the removing of the first oxide feature comprises etching the first and second oxide features simultaneously.

15. The method of claim 8, wherein the simultaneously oxidizing of the first source/drain region and the second source/drain region is after the forming of the first via opening and the forming of the second via opening.

16. The method of claim 8,
wherein the selectively forming of the first epitaxial feature does not form the first epitaxial feature over the first blocking layer,
wherein the selectively forming of the second epitaxial feature does not form the second epitaxial feature over the second blocking layer.

17. A semiconductor device, comprising:
an n-type device region comprising a first source/drain region and a first source/drain capping layer over the first source/drain region;
a p-type device region comprising a second source/drain region and a second source/drain capping layer over the second source/drain region; and
a barrier layer disposed on the first source/drain capping layer and the second source/drain capping layer,
wherein the first source/drain capping layer comprises silicon doped with an n-type dopant at a concentration greater the maximum solid solubility of the n-type dopant in silicon,
wherein a width of a bottom surface of the barrier layer over the second source/drain capping layer is smaller than a width of a top surface of the second source/drain capping layer.

18. The semiconductor device of claim 17, wherein the n-type dopant is phosphorous.

19. The semiconductor device of claim 17, wherein the concentration is between about $7 \times 10^{21}$ atoms/cm$^3$ and about $1.5 \times 10^{22}$ atoms/cm$^3$.

20. The semiconductor device of claim 17, wherein the p-type device region further comprises a contact etch stop layer disposed over a portion of the second source/drain region and a portion of the second source/drain capping layer.

* * * * *